US006841793B2

United States Patent
Lee

(10) Patent No.: US 6,841,793 B2
(45) Date of Patent: Jan. 11, 2005

(54) PHASE-CHANGEABLE DEVICES HAVING AN INSULATING BUFFER LAYER AND METHODS OF FABRICATING THE SAME

(75) Inventor: Se-Ho Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/620,830

(22) Filed: Jul. 16, 2003

(65) Prior Publication Data

US 2004/0037179 A1 Feb. 26, 2004

(30) Foreign Application Priority Data

Aug. 23, 2002 (KR) ................................ 10-2002-0050120

(51) Int. Cl.$^7$ ................................................ H01L 47/00
(52) U.S. Cl. .................... 257/3; 257/2; 257/4; 257/5; 438/95; 438/98
(58) Field of Search ........................ 257/2–5; 438/95, 438/98

(56) References Cited

U.S. PATENT DOCUMENTS 5,166,758 A * 11/1992 Ovshinsky et al. ............ 257/3
5,789,758 A * 8/1998 Reinberg ...................... 257/3

* cited by examiner

Primary Examiner—David Nelms
Assistant Examiner—Andy Huynh
(74) Attorney, Agent, or Firm—Myers Bigel Sibley & Sajovec

(57) ABSTRACT

Phase-changeable devices and method of fabricating phase-changeable devices are provided. The phase-changeable devices have a first insulating layer disposed on a first electrode. A heater plug extends through the first insulating layer and contacts the first electrode. A buffer insulating layer region is disposed on the first insulating layer opposite the first electrode and a phase-changeable material region is disposed on the buffer insulating layer region. The phase-changeable material region may extend into the buffer insulating layer region. The phase-changeable material region contacts a surface of the heater plug. A second electrode disposed on the phase-changeable material region. Spacers may be provided on sidewalls of the buffer insulating layer region between the phase-changeable material region and the buffer insulating layer region. The buffer insulating layer region may have a thermal expansion coefficient between the thermal expansion coefficients of the first insulating layer and the phase-changeable material region.

30 Claims, 13 Drawing Sheets

PHASE-CHANGEABLE DEVICES HAVING AN INSULATING BUFFER LAYER AND METHODS OF FABRICATING THE SAME

CLAIM FOR PRIORITY

The present application is related to and claims priority from Korean Application No. 2002-50120, filed Aug. 23, 2002, the disclosure of which is incorporated herein as if set forth in its entirety.

FIELD OF THE INVENTION

The present invention relates to semiconductor memory devices and, more specifically, to phase-changeable memory devices and methods of fabricating the same.

BACKGROUND OF THE INVENTION

Semiconductor memory devices for storing data can typically be classified into volatile memory devices and non-volatile memory devices according to whether the memory devices store or lose data when their power supplies are interrupted. Dynamic Random Access Memory (DRAM) and Static Random Access Memory (SRAM) devices are examples of typical volatile memory devices and FLASH memory devices are examples of typical non-volatile memory devices. These typical memory devices represent a logical value "0" or "1" depending on whether the devices stores electrons or not. DRAM devices need to be refreshed periodically as they typically require a high capability of storing electrons. Therefore, extensive studies have been made to increase the surface area of a capacitor electrode. However, as the surface area of a capacitor electrode increases, the ability to provide highly integrated DRAM devices may be reduced.

Conventional FLASH memory cells include a gate pattern comprising a gate insulating layer, a floating gate, a dielectric layer and a control gate. Programming and erasing operations of the FLASH memory cell are achieved through the F-N (Fowler-Nordheim) tunneling effect through a gate insulating layer. The F-N tunneling typically occurs when an operation voltage is higher than a power supply voltage. Thus, FLASH memory devices typically require a separate voltage generation circuit for programming operations.

Highly integrated non-volatile, randomly accessible memory devices with a relatively simple structure may also be provided by a phase-changeable memory device. The phase-changeable memory device utilizes phase-changeable material. A chalcogenide material layer, for example, a compound material layer including germanium (Ge), stibium (Sb) and tellurium (Te) (e.g., GST layer) has conventionally been used as the phase-changeable material. Depending on an applied current (i.e., joules of heat), the phase-changeable material is electrically switched from an amorphous state to a crystalline state or to various resistivities while in the crystalline state.

FIG. 1A is a partial cross-sectional view of a conventional phase-changeable memory cell of a conventional phase-changeable memory device. Referring to FIG. 1A, a conventional phase-changeable memory device includes a lower conductive pattern (i.e., a lower electrode 10), a silicon oxide layer 12 thereon, a phase-changeable material pattern 16 and an upper conductive pattern (i.e., an upper electrode 18) on the phase-changeable material pattern 16. The phase-changeable material pattern 16 is electrically connected to the lower electrode 10 through a contact plug 14 (i.e. a heater plug) that extends through the silicon oxide layer 12. When a current flows between the upper and lower electrodes 10 and 18 of the conventional phase-changeable memory device, the crystalline state of the phase-changeable material of an active interface 20 changes depending on the intensity of the current passing through the active interface 20. The active interface 20 is an interface between the heater plug 14 and the phase-changeable material pattern 16.

FIG. 1B shows region 16a where crystalline state changes. As seen in FIG. 1B, along the direction of the arrows of FIG. 1B, a phase transition occurs from the top surface of the heater plug 14.

The current required to change the crystalline state of the phase-changeable material is affected by the active interface 20 of the phase-changeable material pattern 16 and the heater plug 14. Therefore, the smaller the active interface 20 is, the less operating current is required. Accordingly, studies that have been conducted on the phase-changeable memory device have focused on reducing the area of the active interface.

The thermal expansion coefficient of the silicon oxide layer 12 ($\alpha$ ($SiO_2$)) is about 0.6 ppm/K and that of a GTS pattern ($\alpha$ (GTS)) is about 23 ppm/° K. As the phase-changeable memory device performs repeated memory operations resulting in a phase transition, thermal stress may occur due to the difference of thermal expansion coefficient between the phase-changeable material pattern and the silicon oxide layer. The crystalline state changes isotropically on the heater plug 14, so that edge of a top surface of the heater plug 14, that is, interfaces 20a and 20b between the material pattern 16 and the silicon oxide layer 12 may be weakened. Thus, stress-driven defects and micro damages of the interface 20a and 20b may occur and may result in an increase in leakage current. Ultimately, a phase transition may not take place at the active interface, thereby degrading stability and reliability of the memory device.

SUMMARY OF THE INVENTION

Embodiments of the present invention provide phase-changeable devices and method of fabricating phase-changeable devices having a first insulating layer disposed on a first electrode. A heater plug extends through the first insulating layer and contacts the first electrode. A buffer insulating layer region is disposed on the first insulating layer opposite the first electrode and a phase-changeable material region is disposed on the buffer insulating layer region. The phase-changeable material region extends into the buffer insulating layer region so as to contact a surface of the heater plug. A second electrode disposed on the phase-changeable material region.

In further embodiments of the present invention, the phase-changeable device is a memory device and the first electrode is electrically connected to an impurity diffusion layer of a substrate with an insulating layer interposed therebetween. A second insulating layer may also be disposed on the buffer insulating layer region so as to cover the second electrode and the phase-changeable material region. A contact plug may connect the second electrode through the second insulating layer. A metal interconnection may be disposed on the contact plug and second insulating layer.

In additional embodiments of the present invention, a thermal expansion coefficient of the buffer insulating layer region is between a thermal expansion coefficient of the first insulating layer and a thermal expansion coefficient of the phase-changeable material region. Additionally, the first insulating layer may be a silicon oxide layer, the buffer insulating layer region may be a silicon nitride layer and the phase-changeable material region may be a Germanium, Stibium and Tellurium (GST) region.

In further embodiments of the present invention, the buffer insulating layer region extends from an edge toward a center of the heater plug so as to cover a portion of a surface of the heater plug.

Sidewall spacers may also be provided between sidewalls of an opening in the buffer insulating layer region and a portion of the phase-changeable material region. In particular embodiments of the present invention, the sidewall spacers are provided where the buffer insulating layer region extends from an edge toward a center of the heater plug so as to cover a portion of a surface of the heater plug. The sidewall spacers may also be formed of silicon nitride.

In yet other embodiments of the present invention, a phase-changeable device includes a first insulating layer disposed on a first electrode, a buffer insulating layer region disposed on the first insulating layer, a heater plug that extends into the buffer insulating layer region and through the first insulating layer, and contacts the first electrode, a phase-changeable material region disposed on the buffer insulating layer region and the heater plug and a second electrode disposed on the phase-changeable material region. In embodiments where the phase-changeable device is a memory device and the first electrode may be electrically connected to an impurity diffusion layer of a substrate with an insulating layer interposed therebetween.

In particular embodiments of the present invention, a thermal expansion coefficient of the buffer insulating layer region is between a thermal expansion coefficient of the first insulating layer and a thermal expansion coefficient of the phase-changeable material region. Also, the first insulating layer may be a silicon oxide layer, the buffer insulating layer region may be a silicon nitride region and the phase-changeable material region comprises a Germanium, Stibium and Tellurium (GST) region.

In further embodiments of the present invention, a second insulating layer disposed on the buffer insulating layer region so as to cover the second electrode and the phase-changeable material region. A contact plug is connected to the second electrode through the second insulating layer and a metal interconnection is disposed on the contact plug and the second insulating layer.

In yet other embodiments of the present invention, a phase-changeable device is fabricated by forming a first insulating layer disposed on a first electrode, forming a heater plug extending through the first insulating layer and contacting the first electrode, forming a buffer insulating layer region disposed on the first insulating layer opposite the first electrode, forming a phase-changeable material region disposed on the buffer insulating layer region, wherein the phase-changeable material region extends into the buffer insulating layer region so as to contact a surface of the heater plug and forming a second electrode disposed on the phase-changeable material region.

In embodiments of the present invention where the phase-changeable device is a memory device, the first electrode may be formed so as to electrically connect to an impurity diffusion layer of a substrate with an insulating layer interposed there between.

In particular embodiments of the present invention, forming a buffer insulating layer region is provided by forming a buffer insulating layer on the heater plug and the first insulating layer, forming a photoresist pattern on the buffer insulating layer and etching the exposed buffer insulating layer using the photoresist pattern as an etching mask so as to provide the buffer insulating layer region. Additionally, spacers may be formed on sidewalls of the buffer insulating layer region adjacent the heater plug. In certain embodiments, the lower insulating layer is formed of silicon oxide, the buffer insulating layer region and the spacers are formed of silicon nitride and the phase-changeable material layer is formed of Germanium, Stibium and Tellurium (GST).

Furthermore, a diameter of an opening defined by the photoresist pattern may be less than a diameter of the heater plug. In such embodiments, the buffer insulating layer region extends from an edge toward a center of the heater plug so as to expose a central portion of a surface of the heater plug. Spacers may be formed on sidewalls of the buffer insulating layer region adjacent the heater plug. The spacers may be formed by forming a spacer insulating layer on the buffer insulating layer region and a portion of the heater plug exposed by the buffer insulating layer region and etching back the spacer insulating layer.

In further embodiments of the present invention, a second insulating layer is formed on the buffer insulating layer region so as to cover the second electrode and the phase changeable material region, a contact plug is formed contacting the second electrode through the second insulating layer and a metal interconnection is formed on the second insulating layer wherein the metal interconnection is electrically connected to the contact plug.

In yet further embodiments of the present invention, a phase-changeable device is fabricated by forming a first insulating layer disposed on a first electrode, forming a buffer insulating layer region disposed on the first insulating layer, forming a heater plug that extends into the buffer insulating layer region and through the first insulating layer, and contacts the first electrode, forming a phase-changeable material region disposed on the buffer insulating layer region and the heater plug and forming a second electrode disposed on the phase-changeable material region.

DESCRIPTION OF THE PREFERRED EMBODIMENTS

Figure 1A:
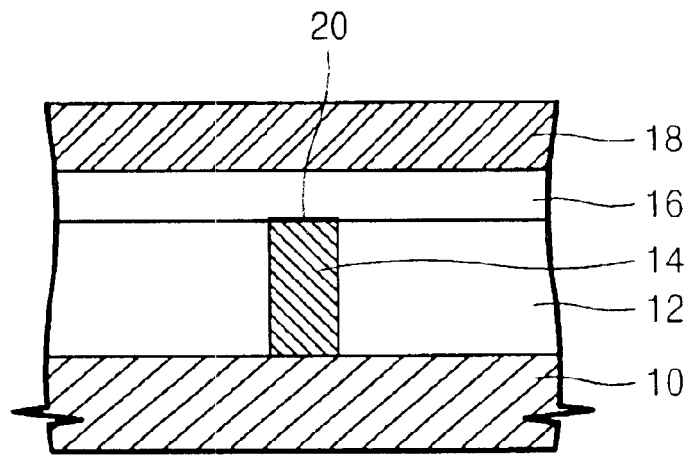
FIG. 1A is a partial schematic cross-sectional view of a conventional phase-changeable memory device.
Figure 1B:
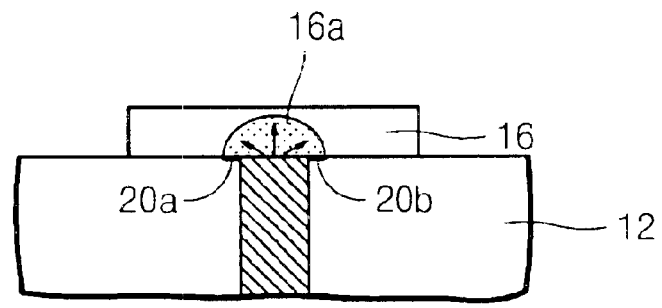
FIG. 1B is an enlargement of a portion of phase-changeable memory device of FIG. 1A.

The present invention now will be described more fully hereinafter with reference to the accompanying drawings, in which typical embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity.

It will be understood that when an element such as a layer, region or substrate is referred to as being "on" another element, it can be directly on the other element or intervening elements may also be present. In contrast, when an element is referred to as being "directly on" another element, there are no intervening elements present. This disclosure also uses relative terms, such as "under" or "beneath," to describe some of the elements in the embodiments. These relative terms are used for the sake of convenience and clarity when referring to the drawings, but are not to be construed to mean that the elements so described can only be positioned relative to one another as shown. For example, when a first element is described as being under a second element in the viewer's frame of reference, it will be understood that the first element may also be located over the second element, if the embodiment were viewed from a different frame of reference, such as if the entire structure were inverted.

Furthermore, the terms "first," "second," "third," etc. are used for reference only and are not intended as being limiting. For example, in some embodiments a first layer may be a second layer in other embodiments. Thus, the terms "first," "second," "third," etc. are not intended to convey a sequence or other hierarchy to the associated elements but are used for identification purposes only.

Figure 2A:
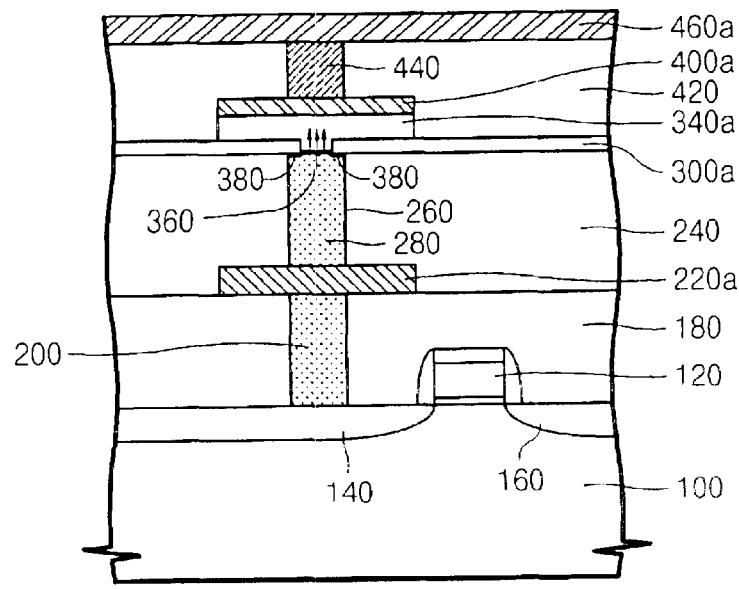
FIG. 2A is a partial schematic cross-sectional view of a phase-changeable memory device in accordance with embodiments of the present invention.
Figure 2B:
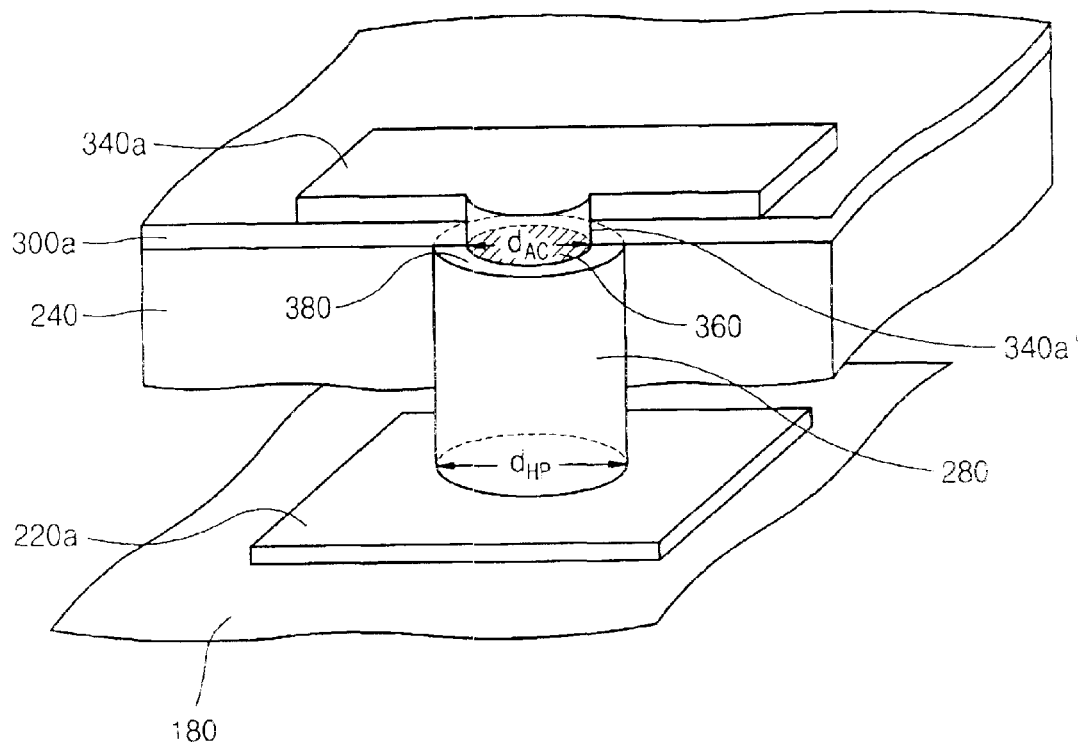
FIG. 2B is a schematic perspective view of a phase-changeable memory device in accordance with embodiments of the present embodiment of the present invention.

Referring to FIGS. 2A and 2B, a cross-sectional view and perspective view schematically illustrate a phase-changeable memory device in accordance with the preferred embodiments of the present invention, respectively. As seen in FIGS. 2A and 2B, the phase-changeable memory device includes a buffer insulating layer region 300a between a lower or first insulating layer 240 with a buried heater plug 280 and a phase-changeable material layer region 340a. The heater plug 280 is surrounded by the lower insulating layer 240 and connects the lower electrodes 220a and the phase-changeable material layer region 340a. An upper electrode 400a is disposed on the phase-changeable material layer region 340a. In more detail, the buffer insulating layer region 300a covers the lower insulating layer 240 and a portion of the heater plug 280 (i.e., an edge 380 of a top surface of the heater plug 280, such as a surface of the heater plug 280 opposite the lower electrodes 220a). Therefore, the buffer insulating layer region 300a defines an opening (referring to 320b of FIG. 7E) exposing a central portion of the heater plug 280. The phase-changeable material layer region 340a is disposed on the buffer insulating layer region 300a and substantially fills the opening defined by the buffer insulating layer region 300a, thereby providing an extension portion 340a' of the phase-changeable material layer region 340a that is in contact with the central portion of the heater plug 280. As a result, the phase-changeable material layer region 340a is T-shaped in respect of a top plane view (referring to FIG. 2A). A portion of the phase-changeable material layer region 340a that is in contact with the heater plug 280 is an active interface 360. Thus, a diameter $d_{AC}$ of the active interface 360 is less than a diameter $d_{HP}$ of the heater plug 280 because the buffer insulating layer region 300a covers the edge of the heater plug 280.

A metal interconnection 460a is disposed on the upper electrode 400a with an upper insulating layer 420 interposed therebetween. The metal interconnection 460a is in contact with a top surface of a contact plug 440 through the upper insulating layer 420, wherein the contact plug 440 is in contact with the upper electrode 400a. Thus, the metal interconnection 460a is electrically connected to the upper electrode 400a. In addition, the lower electrode 220a is electrically connected to an impurity diffusion region 140 of the substrate 100 with an insulating layer 180 interposed therebetween. A contact plug 200 through the insulating layer 180 connects the impurity diffusion region 140 to the lower electrode 220a. Another impurity diffusion region 160 is also formed in the substrate 100. A gate line 120, serving as a word line, is disposed on the substrate 100 between the impurity diffusion regions 140 and 160. The gate line 120 is insulated from peripheral structures by the insulating layer 180. The impurity diffusion regions 140 and 160 and the gate line 120 provide an access transistor for accessing a memory cell, i.e., the phase-changeable material region 340a. A common drain electrode electrically connected to another impurity diffusion region 160 is disposed in the insulating layer 180 (not shown).

When the access transistor is turned on, a current passage is formed between the common drain electrode and the metal interconnection 460a. The current delivered to the metal interconnection 460a through the upper electrode 400a and the contact plug 440 is sensed to judge whether a value stored in the phase-changeable material region 340a is "0" or "1". This is a read operation to the phase-changeable memory device. During the read operation, the common drain electrode is grounded and a predetermined read voltage is applied to the metal interconnection 460a.

Also, if a predetermined current is passed through the common drain region so as to apply heat (i.e., joules of heat), a crystal state of the phase-changeable material layer region 340a changes at the active interface 360. This is a programming operation to the phase changeable memory device. In this case, the metal interconnection 460a is grounded.

This interconnection structure of the heater plug 280 and the phase-changeable material layer region 340a illustrated in FIGS. 2A and 2B may have the following advantages.

First, the active interface 360 is formed to be smaller than the top surface of the heater plug 280. Thus, the phase-changeable memory device can operate with reduced operation current. Second, a buffer insulating layer region 300a intervenes between the phase-changeable material region 340a and a lower insulating layer 240, so that the phase-changeable material region 340a is not in contact with the lower insulating layer 240. Moreover, the buffer insulating layer region 300a absorbs stress due to differences of thermal expansion coefficients. Third, an extension portion 340a' of the phase-changeable material region 340a is surrounded by the buffer insulating layer region 300a, so that a phase transition may occur only in the upward direction (referring to arrows of FIG. 2A). Therefore, the phase-changeable memory devices may have excellent phase transition properties (i.e., a large variation of resistivity).

Figure 3:
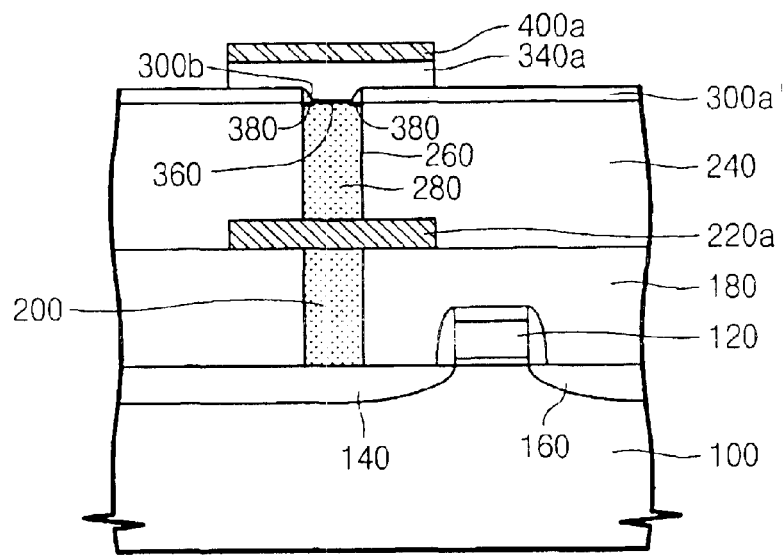
FIG. 3 is a partial schematic cross-sectional view of a phase-changeable memory device in accordance with further embodiments of the present invention.

FIG. 3 is a partial schematic cross-sectional view illustrating a phase-changeable memory device according to further embodiments of the present invention. In FIG. 3, as in FIGS. 2A and 2B, a buffer insulating layer region 300a' is provided between the lower insulating layer 240 and the phase-changeable material region 340a. The buffer insulating layer region 300a' is disposed on the lower insulating layer 240 and a first or top surface of the heater plug 280 opposite the electrode 220a is exposed. In the embodiments illustrated in FIG. 3, sidewall spacers 300b are disposed on both sidewalls of the buffer insulating layer region 300a' and an edge 380 of the heater plug 280. The diameter of the exposed top surface of the heater plug 280 (i.e., the diameter of an active interface 360) is smaller than that of the heater plug 280 because of the sidewall spacers 300b. The phase-changeable material region 340a is in contact with the exposed top surface of the heater plug 280, the buffer insulating layer region 300a' and the sidewall spacers 300b. Therefore, the area of the active interface 360 is smaller than that of the heater plug 280, where the active interface is that portion of the phase-changeable material region 340a contacting the heater plug 280.

Figure 4:
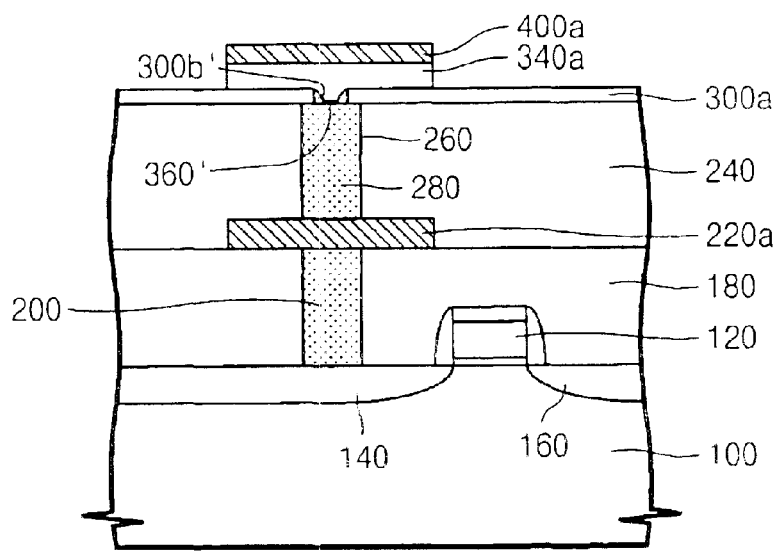
FIG. 4 is a partial schematic cross-sectional view of a phase-changeable memory device in accordance with additional embodiments of the present invention.

FIG. 4 is a partial schematic cross-sectional view illustrating a phase-changeable memory device in accordance with other embodiments of the present invention. In the embodiments illustrated in FIG. 4, the phase-changeable memory device further comprises sidewall spacers 300b'. That is, the sidewall spacers 300b' are disposed on sidewalls of a buffer insulating layer region 300a where the buffer insulating layer region 300a extends onto the surface of the heater plug 280 that is opposite the electrode 220a. Accordingly, the area of the active interface 360' of the phase-changeable material region 340a may be further reduced, for example, over the area of the active interface 360 if FIGS. 2A and 2B.

Figure 5:
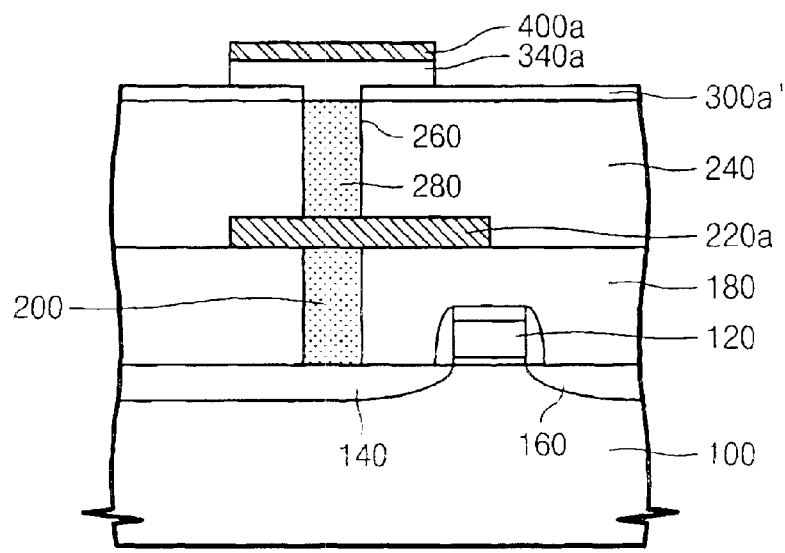
FIG. 5 is a partial schematic cross-sectional view of a phase-changeable memory device in accordance with additional embodiments of the present invention.

FIG. 5 is a partial schematic cross-sectional view illustrating a phase-changeable memory device according to further embodiments of the present invention. The phase-changeable memory device of the embodiments illustrated in FIG. 5 is identical with that of FIG. 3 except that there are no sidewall spacers 300b. That is, a buffer insulating layer region 300a' is interposed between a lower insulating layer 240 and a phase-changeable material region 340a. The buffer insulating layer region 300a' is disposed on the lower insulating layer 240 so as to expose all of the first or top surface of a heater plug 280 that is opposite the electrode 220a. The phase-changeable material region 340a is disposed on the buffer insulating layer region 300a', thereby being in contact with the exposed top surface of the heater plug 280. As a result, the phase-changeable material region 340a may be T-shaped.

Figure 6:
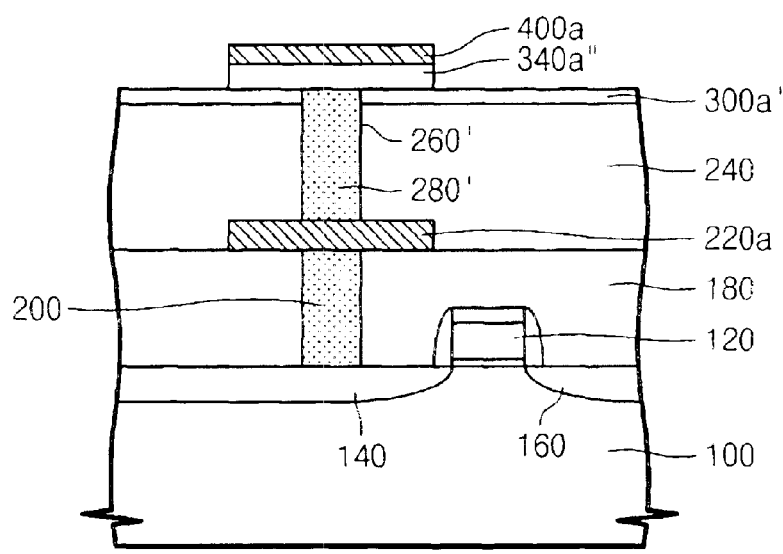
FIG. 6 is a partial schematic cross-sectional view of a phase-changeable memory device in accordance with additional embodiments of the present invention.

FIG. 6 is a partial schematic cross-sectional view illustrating a phase-changeable memory device in accordance with still other embodiments of the present invention. Heater plug 280' of the embodiments illustrated in FIG. 6 goes through not only the lower insulating layer 240 but also a buffer insulating layer region 300a'. Thus, a surface of the heater plug 280' may be substantially coplanar with a surface of the buffer insulating layer region 300a' opposite the lower insulating layer 240. The phase-changeable material region 340a" is disposed on the buffer insulating layer region 300a' and the heater plug 280'.

Figure 7A:
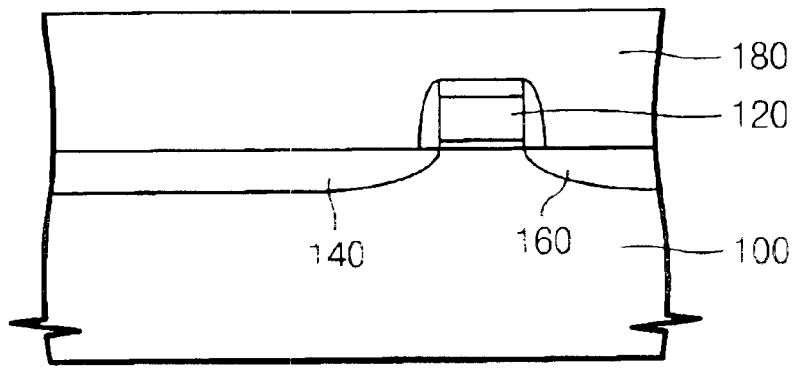
FIGS. 7A–7I are cross-sectional views of a portion of a substrate illustrating methods of fabricating a phase-changeable memory device of FIGS. 2A and 2B.

FIGS. 7A–7I are partial cross-sectional views illustrating methods of fabricating a phase-changeable memory device of FIGS. 2A and 2B. Referring to FIG. 7A, there is provided a substrate 100 including an access transistor and a common drain electrode. A device isolation process may be performed using a conventional method and then, an access transistor is formed on the substrate 100. The access transistor may include impurity diffusion regions 140 and 160 and a gate line 120. The impurity diffusion regions 140 and 160 serve as a source region and a drain region, respectively. A common drain electrode is formed to electrically connect the impurity diffusion region 160. An insulating layer 180 is formed on a surface of the substrate 100.

Figure 7B:
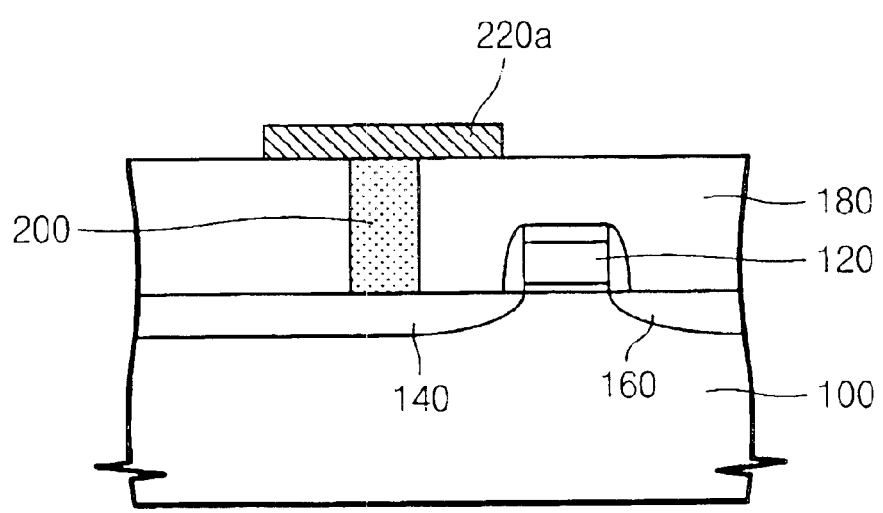

Referring to FIG. 7B, the insulating layer 180 is patterned to form a contact hole exposing the impurity active region 140. Conductive material layer is deposited on the insulating layer 180 so as to fill the contact hole and then, a planarization process is performed to form a contact plug 200. An electrode material layer is formed on the contact plug 200 and insulating layer 180 and then patterned to form a lower electrode 220a that is in contact with the contact plug 200. The lower electrode 220a may be formed of, for example, tungsten.

Figure 7C:
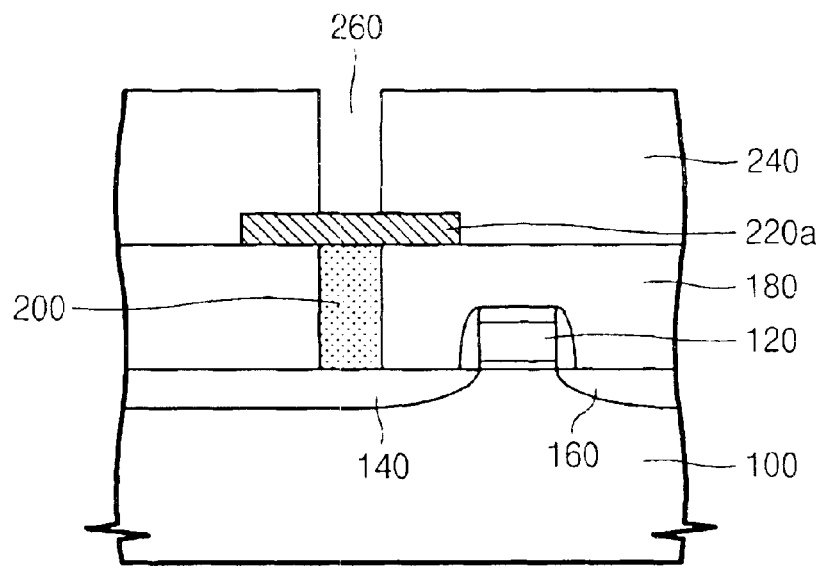

Referring to FIG. 7C, a lower insulating layer 240 is formed on the resulting structure with the lower electrode 220a. The lower insulating layer 240 may be formed of, for example, silicon oxide ($SiO_2$). The lower insulating layer 240 is patterned to form a contact hole 260 exposing the lower electrode 220a.

Figure 7D:
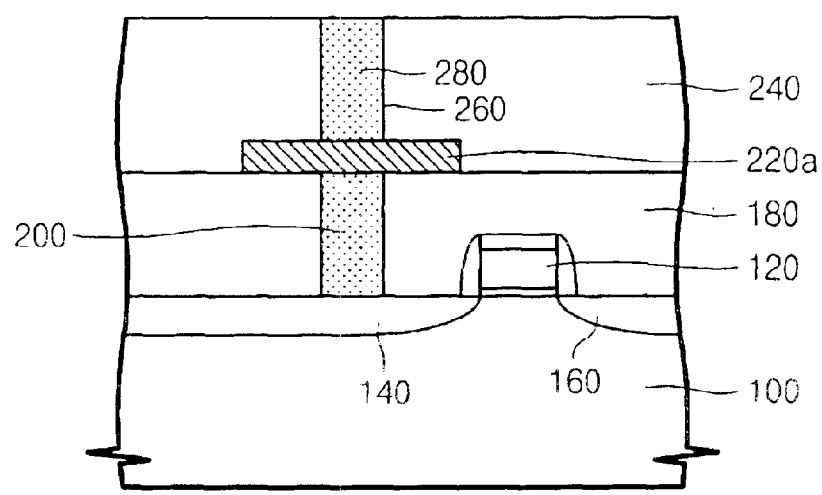

Referring to FIG. 7D, a conductive material layer is deposited on the lower insulating layer 240 so as to fill the contact hole 260 and then planarized to form a heater plug 280. The heater plug 280 is formed of, for example, titanium nitride (TiN).

Figure 7E:
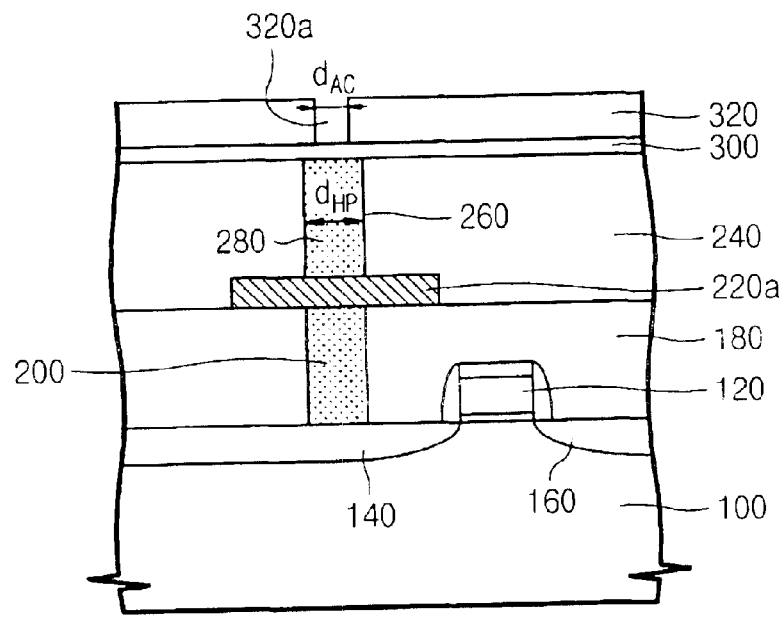

Referring to FIG. 7E, a buffer insulating layer 300 is formed on the heater plug 280 and the lower insulating layer 240. The buffer insulating layer 300 is formed to a thickness of about 300–500 Å. The buffer insulating layer 300 serves as a stress absorbing layer due to differences of thermal expansion coefficients of the lower insulating layer 240 and the phase-changeable material layer 340 that will be formed in a subsequent process. Thus, the buffer insulating layer 300 is formed of insulating material having thermal expansion coefficient between those of the lower insulating layer 240 and the phase-changeable material layer 340. For example, silicon nitride ($Si_3N_4$) may be the insulating material used for the buffer insulating layer 300. The thermal expansion coefficient of silicon nitride (i.e., $\alpha$ ($Si_3N_4$)≈3.0 ppm/° K.) is about 5 times larger than that of silicon oxide (i.e., $\alpha$ ($SiO_2$)≈0.6 ppm/° K.). Thus, the buffer insulating layer 300 is interposed between the phase-changeable material layer 340 having a relatively large thermal expansion coefficient (i.e., a (GST)≈23 ppm/° K.) and a silicon oxide lower insulating layer 240 having a relatively small thermal expansion coefficient. Thus, stress-driven defects due to a thermal stress may be reduced and/or prevented.

Referring to FIG. 7E, again, a photoresist layer is formed on the buffer insulating layer 300 and patterned to form a photoresist pattern 320 defining an opening 320a. The opening 320a is arranged on the heater plug 280. A diameter $d_{AC}$ of the opening 320a is formed to be smaller than a diameter $d_{HP}$ of the heater plug 280.

Figure 7F:
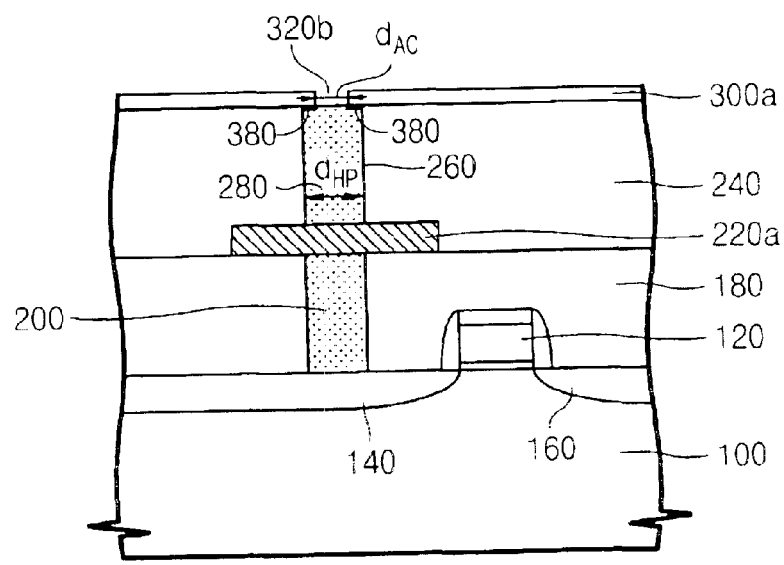

Referring to FIG. 7F, using the photoresist pattern 320 as an etching mask, the exposed buffer insulating layer 300 thereunder is etched to form a buffer insulating layer region 300a having an opening 320b. The photoresist pattern 320 is then removed. Accordingly, the buffer insulating layer region 300a includes an opening 320b corresponding to the opening 320a defined by the photoresist pattern 320. The opening 320b defined by the buffer insulating layer region 300a exposes a portion of the heater plug 280, e.g., a center portion of the heater plug 280. In other words, the buffer insulating layer region 300a is formed on the lower insulating layer 240 and extends to cover a portion of an edge 380 of the heater plug 280.

Figure 7G:
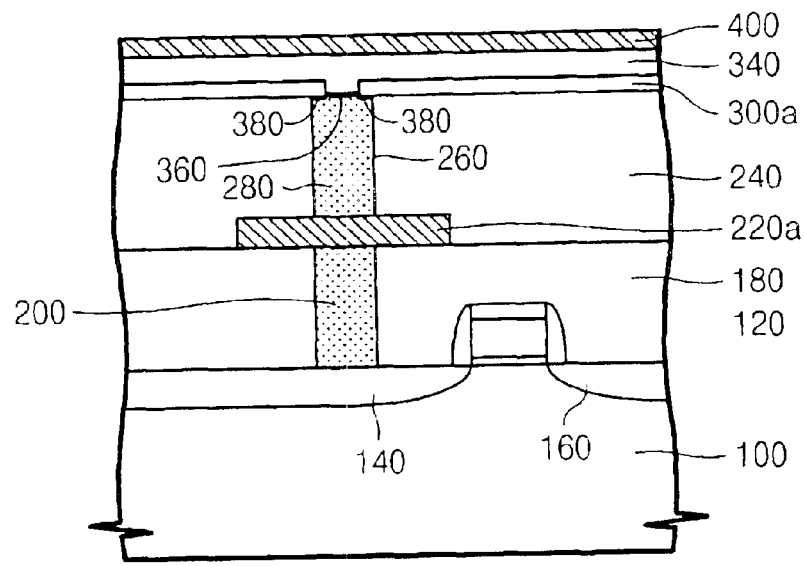

Referring to FIG. 7G, a phase-changeable material layer 340 is formed on the buffer insulating layer region 300a so as to fill the opening 320b. The phase-changeable material layer 340 is formed of, for example, GTS. In certain embodiments, the phase-changeable material layer 340 has a thickness of about 1000 Å. That is, the phase-changeable material layer 340 is formed on sidewalls and a top surface of the buffer insulating layer region 300a opposite the lower insulating layer 240 and is formed on the exposed portion, e.g., the center, of the heater plug 280. In this case, a portion of the phase-changeable material layer 340 contacting the heater plug 280 is an active interface. The area of the active interface 360 is smaller than that of a cross-section of the heater plug 280.

An upper electrode material layer 400 is formed on the phase-changeable material layer 340. For example, the upper electrode material layer 400 may be formed of the same material as the lower electrode 220a.

Figure 7H:
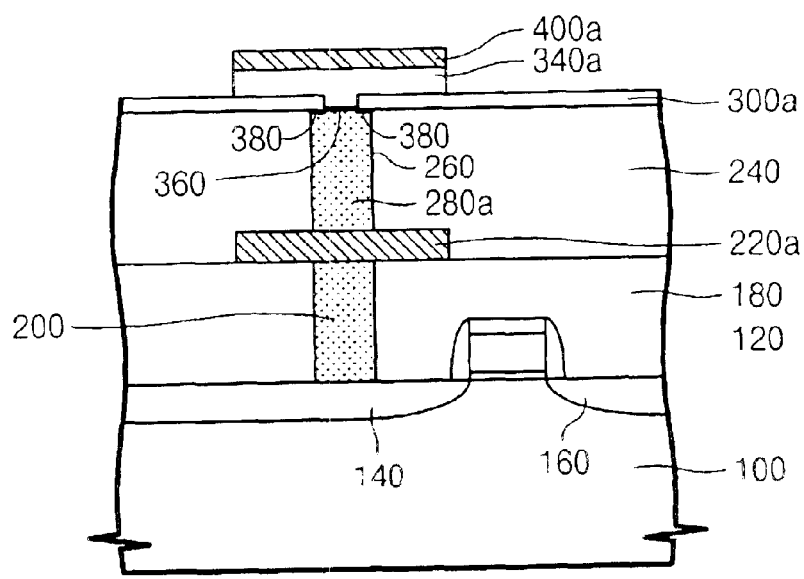

Referring to FIG. 7H, the upper electrode material layer 400 and the phase-changeable material layer 340 are patterned to form an upper electrode 400a and a phase-changeable material region 340a. The phase-changeable material region 340a is formed so as to remain in contact with the heater plug 280.

Figure 7I:
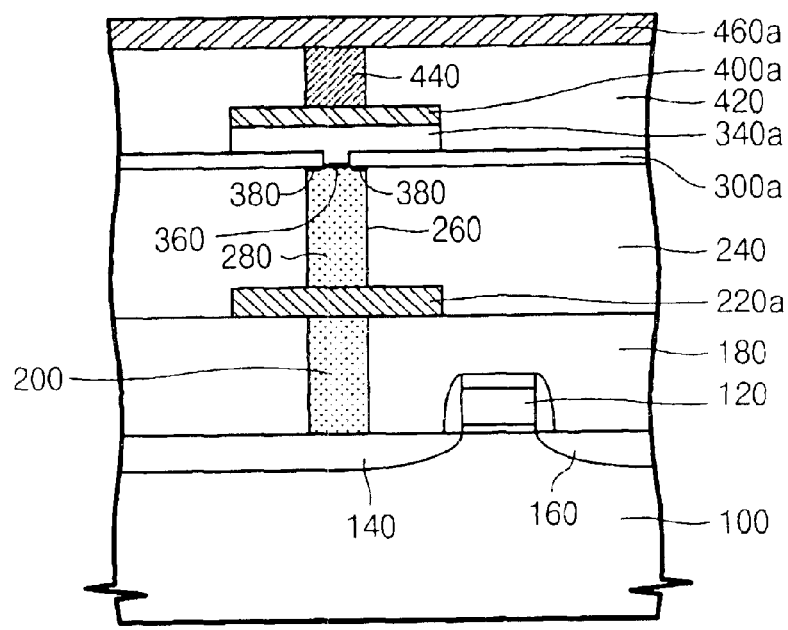

Referring to FIG. 7I, an upper insulating layer 420 is formed on the resulting structure of FIG. 7H with the upper electrode 400a and the phase-changeable material region 340a. The upper insulating layer 420 is patterned to form a contact hole exposing the upper electrode 400a. A conductive layer is formed on the upper insulating layer 420 so as to fill the contact hole and then planarized to form a contact plug 440. A conductive layer is deposited on the upper insulating layer 420 and the contact plug 440 and then patterned to form a metal interconnection 460a that is electrically connected to the contact plug 440. The metal interconnection 460a is formed of, for example, aluminum.

Methods of fabricating a phase-changeable memory device shown in FIG. 3, will now be explained with reference to FIGS. 8A–8E. Except as described herein, fabrication of embodiments of the present invention as illustrated in FIG. 3 may be the same as discussed above with reference to FIGS. 7A–7I. Thus, only the differences between the processing of FIGS. 7A–7I will be discussed in detail below.

Figure 8A:
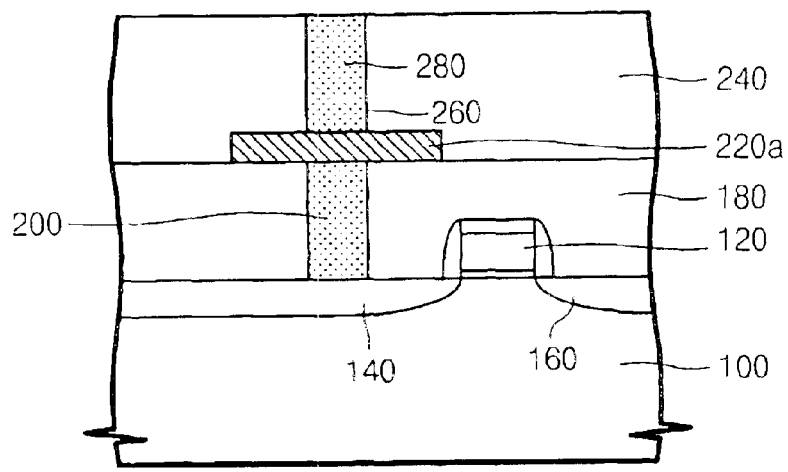
FIGS. 8A–8E are cross-sectional views of a portion of a substrate illustrating methods of fabricating a phase-changeable memory device of FIG. 3.

Referring to FIG. 8A, impurity diffusion regions 140 and 160, a gate line 120, a common drain electrode, an insulating layer 180, a contact plug 200, a lower electrode 220a, a lower insulating layer 240 and a heater plug 280 are formed.

Figure 8B:
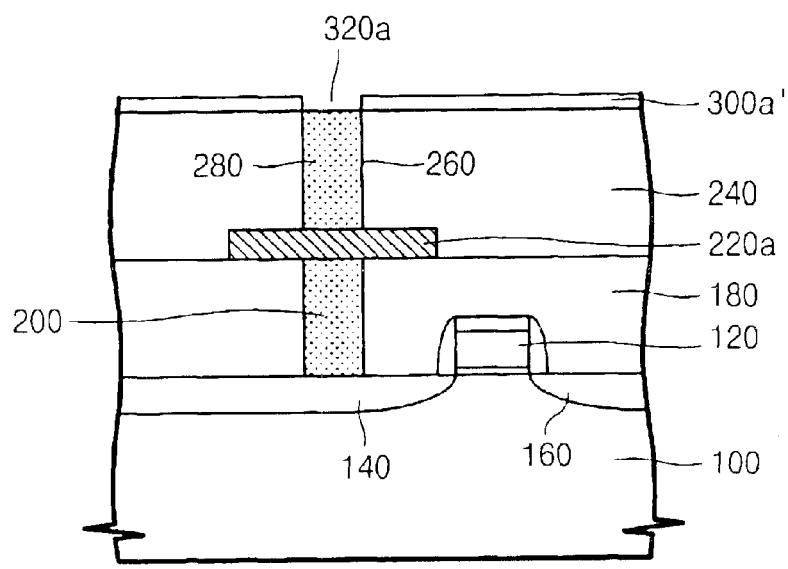

Referring to FIG. 8B, a buffer insulating layer region 300a' is formed on the lower insulating layer 240. The buffer insulating layer is formed on the lower insulating layer 240 and the heater plug 280 and patterned to form a buffer insulating layer region 300a'. As illustrated in FIG. 8B, the buffer insulating layer region 300a' includes an opening 320a that exposes the surface of the heater plug 280 that is substantially coplanar with a surface of the buffer insulating layer region 300a' and a surface of the lower insulating layer 240.

Figure 8C:
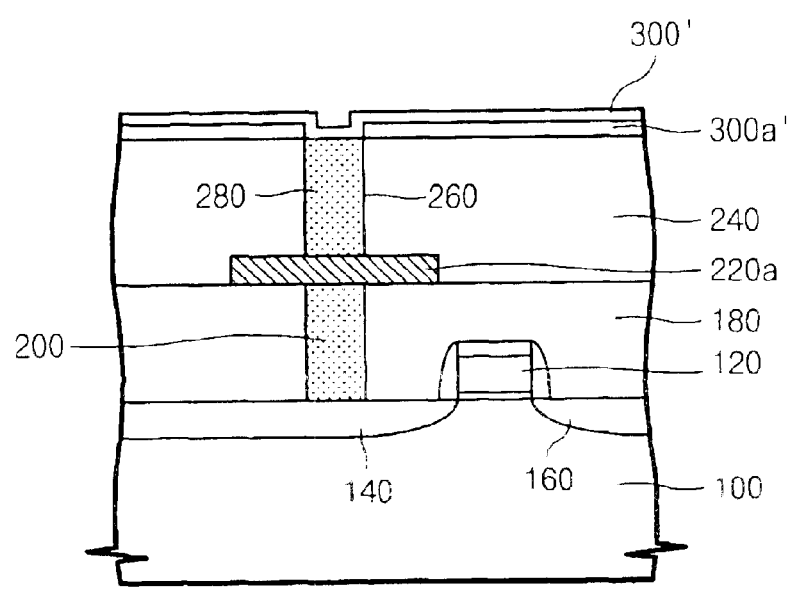

Referring to FIG. 8C, a spacer insulating layer 300' is formed on the heater plug 280 and on the buffer insulating layer region 300a'. The spacer insulating layer 300' may be uniformly (i.e., conformally) formed along an outline of the underlying structure.

Figure 8D:
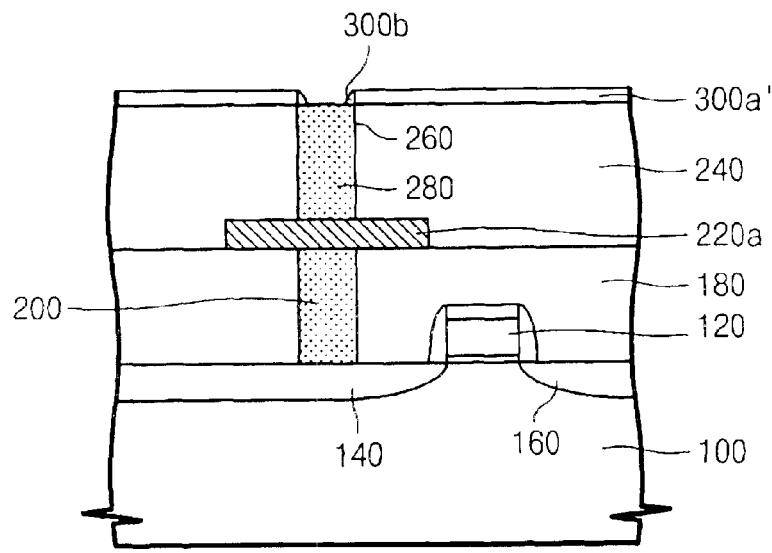

Referring to FIG. 8D, an etch back process is applied to the spacer insulating layer 300', thereby forming spacers 300b on either sidewall of the buffer insulating layer region 300a'.

Figure 8E:
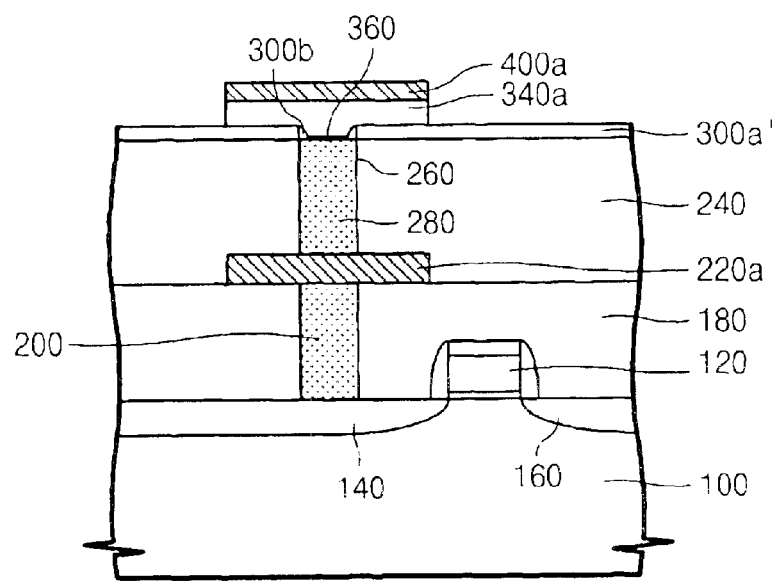

Referring to FIG. 8E, a phase-changeable material region 340a and an upper electrode 400a are formed as described above. In the embodiments illustrated in FIG. 8E, an area of an active interface 360 is less than the cross-section area of the heater plug 280 because of the spacers 300b.

Methods of fabricating a phase-changeable memory device of FIG. 5 may be substantially identical as that illustrated in FIGS. 8A–8E except that spacers are not formed. That is, as illustrated in FIG. 8B, the buffer insulating layer region 300a' is formed on the lower insulating layer 240 so as to expose the top surface of the heater plug 280. A phase-changeable material layer and an upper electrode material layer are then sequentially formed on the buffer insulating layer region 300a' and the heater plug 280 and then patterned to form a phase-changeable material region 340a and an upper electrode 400a.

In methods of fabricating a phase-changeable memory device of FIG. 6, a heater plug 280' is formed through the buffer insulating layer region 300a'. That is to say, a lower electrode 220a is formed and a lower insulating layer 240 and a buffer insulating layer 300 are sequentially formed and then patterned to form a contact hole 260' exposing the lower electrode 220a. A conductive material layer is formed on the patterned buffer insulating layer 300a' to fill the contact hole 260'. A planarization process is applied to form a heater plug 280'. A phase-changeable material layer and an upper electrode layer are then sequentially formed and patterned to form an upper electrode 400a and a phase-changeable material region 340".

FIGS. 9A–9D are partial cross-sectional views illustrating methods of fabricating a phase-changeable memory device of the FIG. 4. Except as described herein, fabrication of embodiments of the present invention as illustrated in FIG. 4 may be the same as discussed above with reference to FIGS. 7A–7I. Thus, only the differences between the processing of FIGS. 7A–7I will be discussed in detail below.

Figure 9A:
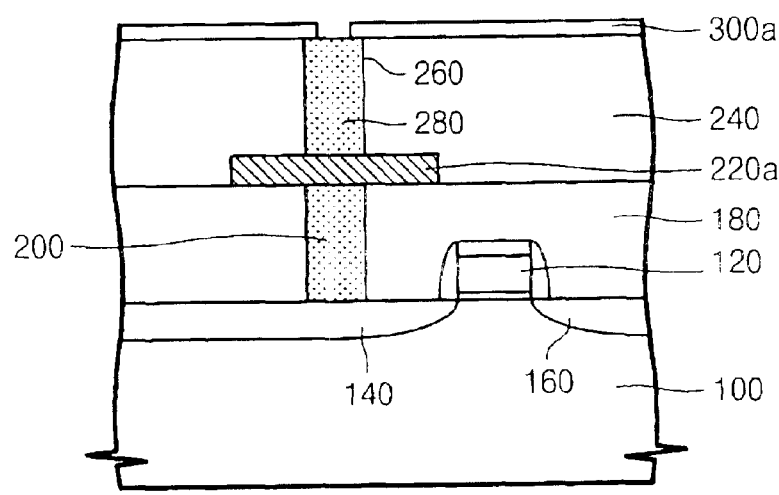
FIGS. 9A–9D are cross-sectional views illustrating methods of fabricating a phase-changeable memory device of FIG. 4.

Referring to FIG. 9A, impurity diffusion regions 140 and 160, a gate line 120, a common drain electrode, an insulating layer 180, a contact plug 200, a lower electrode 220a, a lower insulating layer 240, a heater plug 280 and a buffer insulating layer region 300a are formed as discussed above. The buffer insulating layer region 300a includes an opening that exposes a portion (e.g., a center part) of a surface of the heater plug 280.

Figure 9B:
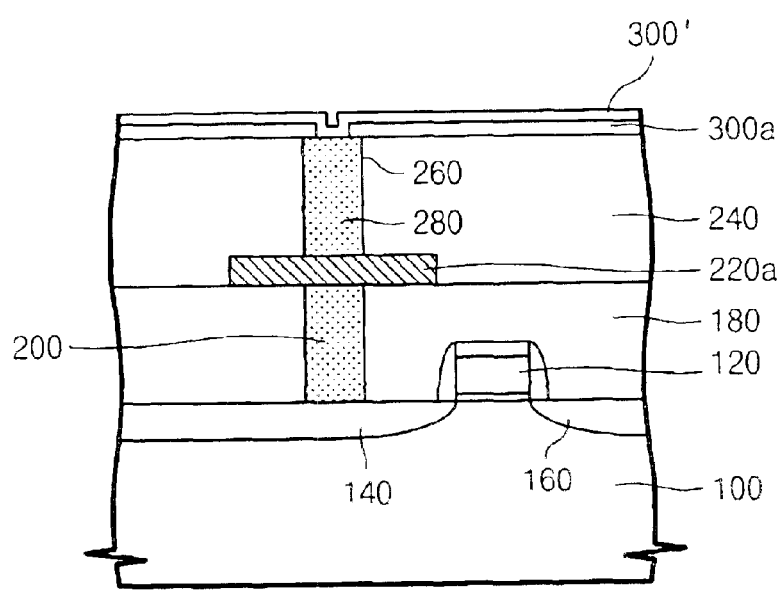

Referring to FIG. 9B, a spacer insulating layer 300' is conformally formed on the exposed heater plug 280 and buffer insulating layer region 300a.

Figure 9C:
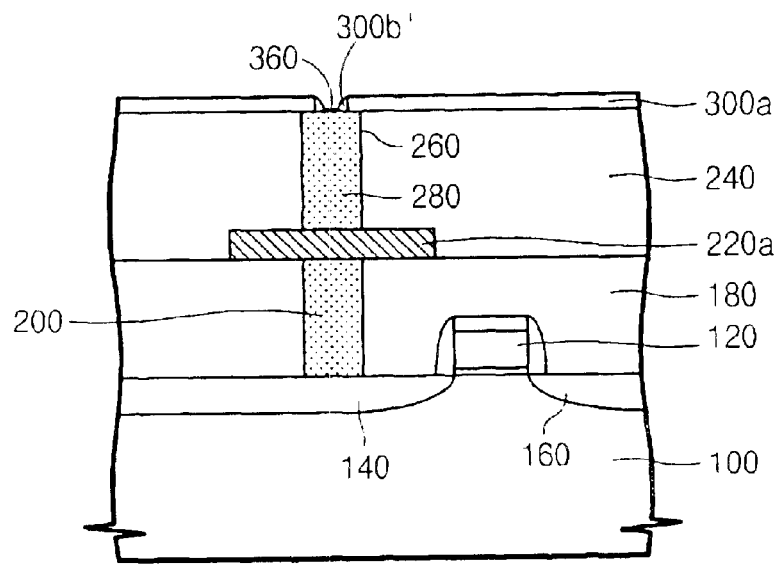

Referring to FIG. 9C, an etch back process is applied to the spacer insulating layer 300' so as to form spacers 300b' on sidewalls of the buffer insulating layer region 300a.

Figure 9D:
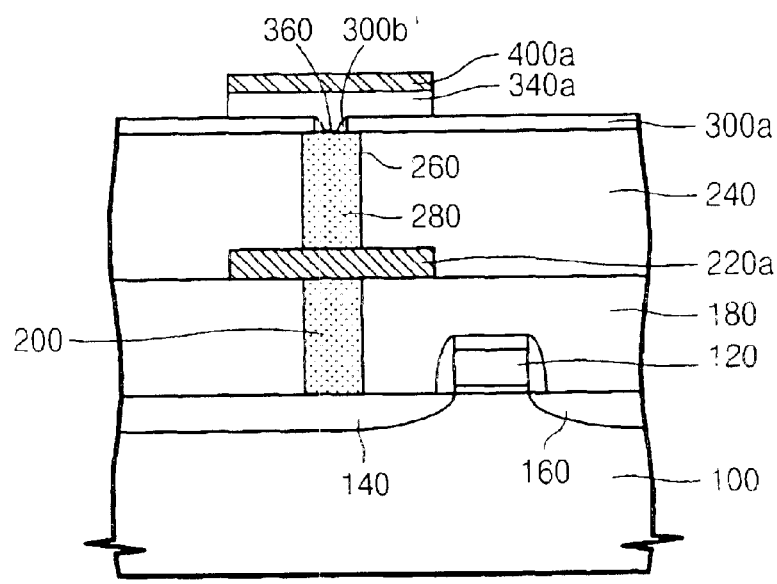

Referring to FIG. 9D, as previously mentioned, a phase-changeable material region 340a and an upper electrode 400a are also formed.

Phase-changeable memory devices of the present invention include a buffer insulating layer region between a phase-changeable material region (e.g., a phase-changeable memory cell) and a lower insulating layer. Therefore, stress-driven defects and interface defects due to thermal stress may be reduced and/or prevented and leakage current may also be reduced.

In addition, the area of an active interface may be decreased because a buffer insulating layer region or spacer covers a portion of the heater plug. Thus, a phase-changeable memory device may operate with a lower operating current.

Furthermore, a phase-changeable material region may protrude downward and the protruding portion may be surrounded by a buffer insulating layer region and/or spacers. Accordingly, phase transition may occur only in an upward direction, which may increase the effectiveness of the phase transition for a given current.

The present invention may be embodied in different forms and should not be constructed as limited to the embodiments set forth herein. Rather, these embodiments are provided so that this disclosure will be thorough and complete, and will fully convey the scope of the invention to those skilled in the art.

What is claimed is:

1. A phase-changeable device comprising:
   a first insulating layer disposed on a first electrode;
   a heater plug extending through the first insulating layer and contacting the first electrode;
   a buffer insulating layer region disposed on the first insulating layer opposite the first electrode;
   a phase-changeable material region disposed on the buffer insulating layer region, wherein the phase-changeable material region extends into the buffer insulating layer region so as to contact a surface of the heater plug; and
   a second electrode disposed on the phase-changeable material region.

2. The phase-changeable device of claim 1, wherein the phase-changeable device comprises a memory device and wherein the first electrode is electrically connected to an impurity diffusion layer of a substrate with an insulating layer interposed there between.

3. The phase-changeable device of claim 1, wherein a thermal expansion coefficient of the buffer insulating layer region is between a thermal expansion coefficient of the first insulating layer and a thermal expansion coefficient of the phase-changeable material region.

4. The phase-changeable device of claim 3, wherein the first insulating layer comprises a silicon oxide layer, the buffer insulating layer region comprises a silicon nitride layer and the phase-changeable material region comprises a gallium, stibium and tellurium (GST) region.

5. The phase-changeable device of claim 1, wherein the buffer insulating layer region extends from an edge toward a center of the heater plug so as to cover a portion of a surface of the heater plug.

6. The phase-changeable device of claim 5, wherein a thermal expansion coefficient of the buffer insulating layer region is between a thermal expansion coefficient of the first insulating layer and a thermal expansion coefficient of the phase-changeable material region.

7. The phase-changeable device of claim 6, wherein the first insulating layer comprises a silicon oxide layer, the buffer insulating layer region comprises a silicon nitride region and the phase-changeable material region includes a gallium, stibium and tellurium (GST) region.

8. The phase-changeable device of claim 1, further comprising sidewall spacers between sidewalls of an opening in the buffer insulating layer region and a portion of the phase-changeable material region.

9. The phase-changeable device of claim 8, wherein a thermal expansion coefficient of the buffer insulating layer region is between a thermal expansion coefficient of the first insulating layer and a thermal expansion coefficient of the phase-changeable material region.

10. The phase-changeable device of claim 9, wherein the first insulating layer comprises a silicon oxide layer, the buffer insulating layer region and the spacers comprise silicon nitride regions and the phase-changeable material region includes a gallium, stibium and tellurium (GST) region.

11. The phase-changeable device of claim 5, further comprising sidewall spacers between sidewalls of an opening of the buffer insulating layer region and a portion of the phase-changeable material region.

12. The phase-changeable device of claim 2 further comprising:
    a second insulating layer disposed on the buffer insulating layer region so as to cover the second electrode and the phase-changeable material region;
    a contact plug connecting the second electrode through the second insulating layer; and
    a metal interconnection disposed on the contact plug and second insulating layer.

13. A phase-changeable device comprising:
    a first insulating layer disposed on a first electrode;
    a buffer insulating layer region disposed on the first insulating layer;
    a heater plug that extends into the buffer insulating layer region and through the first insulating layer, and contacts the first electrode;
    a phase-changeable material region disposed on the buffer insulating layer region and the heater plug; and
    a second electrode disposed on the phase-changeable material region.

14. The phase-changeable device of claim 13, wherein the phase-changeable device comprises a memory device and wherein the first electrode is electrically connected to an impurity diffusion layer of a substrate with an insulating layer interposed therebetween.

15. The phase-changeable device of claim 13, wherein a thermal expansion coefficient of the buffer insulating layer region is between a thermal expansion coefficient of the first insulating layer and a thermal expansion coefficient of the phase-changeable material region.

16. The phase-changeable device of claim 13, wherein the first insulating layer comprises a silicon oxide layer, the buffer insulating layer region comprises a silicon nitride region and the phase-changeable material region comprises a GST region.

17. The phase-changeable device of claim 14 further comprising:
    a second insulating layer disposed on the buffer insulating layer region so as to cover the second electrode and the phase-changeable material region;
    a contact plug connected to the second electrode through the second insulating layer; and
    a metal interconnection disposed on the contact plug and the second insulating layer.

18. A method of fabricating a phase-changeable device comprising:
    forming a first insulating layer on a first electrode;
    forming a heater plug extending through the first insulating layer and contacting the first electrode;
    forming a buffer insulating layer region on the first insulating layer opposite the first electrode;
    forming a phase-changeable material region on the buffer insulating layer region, wherein the phase-changeable material region extends into the buffer insulating layer region so as to contact a surface of the heater plug; and forming a second electrode on the phase-changeable material region.

19. The method of claim 18, wherein the phase-changeable device comprises a memory device, the method further comprising forming the first electrode so as to electrically connect to an impurity diffusion layer of a substrate with an insulating layer interposed there between.

20. The method of claim 18, wherein the forming a buffer insulating layer region comprises:

forming a buffer insulating layer on the heater plug and the first insulating layer;

forming a photoresist pattern on the buffer insulating layer;

etching the exposed buffer insulating layer using the photoresist pattern as an etching mask so as to provide the buffer insulating layer region.

21. The method of claim 20, further comprising forming spacers on sidewalls of the buffer insulating layer region adjacent the heater plug.

22. The method of claim 21, wherein the first insulating layer is formed of silicon oxide, the buffer insulating layer region and the spacers are formed of silicon nitride and the phase-changeable material layer is formed of gallium, stibium and tellurium (GST).

23. The method of claim 20, wherein a diameter of an opening defined by the photoresist pattern is less than a diameter of the heater plug, and wherein the buffer insulating layer region extends from an edge toward a center of the heater plug so as to expose a central portion of a surface of the heater plug.

24. The method of claim 23, further comprising forming spacers on sidewalls of the buffer insulating layer region adjacent the heater plug.

25. The method of claim 24, wherein the forming the spacers comprises:

forming a spacer insulating layer on the buffer insulating layer region and a portion of the heater plug exposed by the buffer insulating layer region; and etching back the spacer insulating layer.

26. The method of claim 23, wherein the first insulating layer is formed of silicon oxide, the buffer insulating layer region and the spacers are formed of silicon nitride and the phase-changeable material layer is formed of gallium, stibium and tellurium (GST).

27. The method of claim 19 further comprising:

forming a second insulating layer on the buffer insulating layer region so as to cover the second electrode and the phase changeable material region;

forming a contact plug contacting the second electrode through the second insulating layer; and forming a metal interconnection on the second insulating layer wherein the metal interconnection is electrically connected to the contact plug.

28. A method of fabricating a phase-changeable device, comprising:

forming a first insulating layer on a first electrode;

forming a buffer insulating layer region on the first insulating layer;

forming a heater plug that extends into the buffer insulating layer region and through the first insulating layer, and contacts the first electrode;

forming a phase-changeable material region disposed on the buffer insulating layer region and the heater plug; and forming a second electrode disposed on the phase-changeable material region.

29. The method of claim 28, wherein the phase-changeable device comprises a memory device, the method further comprising forming the first electrode to electrically connect to an impurity diffusion layer of a substrate with an insulating layer interposed therebetween.

30. The method of claim 28, wherein the first insulating layer is formed of silicon oxide, the buffer insulating layer region is formed of silicon nitride and the phase-changeable material layer is formed of gallium, stibium and tellurium (GST).

* * * * *